(12) United States Patent
Sugita et al.

(10) Patent No.: US 7,863,598 B2
(45) Date of Patent: Jan. 4, 2011

(54) NONVOLATILE MEMORY DEVICE

(75) Inventors: Yasuhiro Sugita, Nara (JP); Yukio Tamai, Tsuchiura (JP)

(73) Assignee: Sharp Kabushiki Kaisha, Osaka (JP)

( * ) Notice: Subject to any disclaimer, the term of this patent is extended or adjusted under 35 U.S.C. 154(b) by 898 days.

(21) Appl. No.: 11/650,577

(22) Filed: Jan. 8, 2007

(65) Prior Publication Data
US 2007/0159868 A1 Jul. 12, 2007

(30) Foreign Application Priority Data
Jan. 6, 2006 (JP) ............................. 2006-001645

(51) Int. Cl.
*H01L 29/06* (2006.01)
*H01L 47/00* (2006.01)
(52) U.S. Cl. .................. 257/5; 257/2; 257/3; 257/4; 257/62; 257/529; 257/530
(58) Field of Classification Search ............. 257/2–5, 257/62, 529, 530
See application file for complete search history.

(56) References Cited

U.S. PATENT DOCUMENTS

| 6,204,139 | B1 | 3/2001 | Liu et al. | |
|---|---|---|---|---|
| 7,378,698 | B2 * | 5/2008 | Ha et al. | 257/295 |
| 2004/0051094 | A1 * | 3/2004 | Ooishi | 257/5 |
| 2004/0130929 | A1 * | 7/2004 | Tsang | 365/145 |
| 2004/0145850 | A1 * | 7/2004 | Fukumoto et al. | 361/143 |
| 2005/0185454 | A1 * | 8/2005 | Brown et al. | 365/171 |
| 2007/0297218 | A1 * | 12/2007 | Abraham et al. | 365/158 |

OTHER PUBLICATIONS

Zhuang et al, "Novell Colossal Magnetoresistive Thin Film Nonvolatile Resistance Random Access Memory (RRAM)", IEDM, 2002, 4 pages.
Baek et al, "Highly Scalable Non-Volatile Resistive Memory using Simple Binary Oxide Driven by Asymmetric Unipolar Voltage Pulses", IEDM 2004, 4 pages.
Sakimura et al, "A 512Kb Cross-Point Cell MRAM", ISSCC, 16.1, 2003, 8 pages.

* cited by examiner

*Primary Examiner*—Zandra Smith
*Assistant Examiner*—Telly D Green
(74) *Attorney, Agent, or Firm*—Nixon & Vanderhye P.C.

(57) ABSTRACT

A nonvolatile memory device comprises memory cells, each including a variable resistor element for storing data in accordance with a change in electrical resistance due to application of electrical stress, and a thermal diffusion barrier on a thermal diffusion path, wherein the thermal diffusion barrier is capable of suppressing a change in resistance of the variable resistor element due to heat diffusion from one of two adjacent memory cells separated by an electrical insulator from each other where heat is generated by applying the electrical stress for changing the electrical resistance of the variable resistor element to the other memory cell via the thermal diffusion path including an electrically conductive wiring material higher in thermal conductivity than that of the electrical insulator.

30 Claims, 15 Drawing Sheets

Sectional View along line X-X    Sectional View along line Y-Y

Sectional View along line X-X    Sectional View along line Y-Y

Sectional View along line X–X    Sectional View along line Y–Y

NONVOLATILE MEMORY DEVICE

CROSS REFERENCE TO RELATED APPLICATION

This Nonvolatile application claims priority under 35 U.S.C. §119(a) on Patent Application No. 2006-001645 filed in Japan on 6 Jan., 2006, the entire contents of which are hereby incorporated by reference.

BACKGROUND OF THE INVENTION

1. Field of the Invention

The present invention relates to a nonvolatile memory device, and particularly to a nonvolatile memory device having a plurality of memory cells arranged in a matrix, each memory cell including a variable resistor element for storage of data through changing its electrical resistance with the use of electrical stress.

2. Description of the Related Art

Flash memories are known as nonvolatile memory devices. Such flash memories have continuously been demanded for downsizing. For the purpose, the charge in the floating gate is declined to minimize the control of threshold voltage or the length of channels is decreased to minimize the withstanding pressure between source and drain. However, the downsizing along a plane of flash memories is now close to its limit.

Improved memories are then proposed where the miniaturization is shifted from along the plane to along a stack of layers (in the vertical direction). Such improved memories include, for example, FeRAM, MRAM, PRAM, and resistive RAM (RRAM: registered trademark of Sharp Corporation). RRAM among them is now focused as most favorable for minimizing the size along the stack of layers. RRAM is designed for modifying the resistance to electrically write data.

Some conventional RRAMs are known including U.S. Pat. No. 6,204,139, "Novell Colossal Magnetoresistive Thin Film Nonvolatile Resistance Random Access Memory (RRAM)" by W. W. Zhung et al, IEDM in 2002, and "Highly Scalable Non-volatile Resistive Memory using Simple Binary Oxide Driven by Asymmetric Unipolar Voltage Pulses" by I. G. Bake et al, IEDM in 2004. In common, the fundamental structure of variable resistor elements in RRAM has a transition metal oxide sandwiched between the upper electrode and the lower electrode. Examples of transition metal oxide are $Pr_xCa_{1-x}MnO_3$, $Sm_xCa_{1-x}MnO_3$, $TiO_2$, $NiO$, $HfO_2$, and $ZrO_2$.

In general, the memory cell array of RRAM may be implemented by a cross-point array (1R array) structure (as depicted in "A 512 kb Cross-Point Cell MRAM" by N. Sakimura et al, ISSCC, 16.1, in 2003). FIG. 10A is a perspective view showing an example of a part of a conventional 1R array circuit (referred to as a conventional device hereinafter). FIG. 10B is a cross sectional view of the conventional device taken along the vertical direction of FIG. 10A. In the drawings, the electrical insulators provided between memory cells are not illustrated.

The conventional device has a number of memory cells 110 arranged at the intersections between the parallelly extending bit lines 101 and the parallelly extending word lines 103 which are orthogonal to the bit lines 101. The memory cell 110 comprises a variable resistor element 102. Since the conventional device needs no switching element such as a transistor provided in each memory cell 110, its memory cell array can easily be constructed in a multi-layer structure where layers are deposited along the vertical direction. Accordingly, when its memory cell 110 has an N number of layers, the memory cell array can be as small as $4F^2/N$ in the area (F being the minimum fabrication line width and N being the number of layers). This allows the area of a memory cell array in a nonvolatile memory device to be smaller.

The read action and the write action in the conventional device will be explained. FIGS. 11 to 13 are schematic views showing the memory cell array structure of a conventional device. A number of word lines WL0 to WLn extend along the columns while a number of bit lines BL0 to BLn extend along the rows. Each memory cell is arranged at the intersection between one of the word lines WL0 to WLn and one of the bit lines BL0 to BLn. In FIGS. 11 to 13, the variable resistor element at each intersection between the word line and the bit line is not illustrated. It is defined that a program action means that the variable resistor element in a memory cell shifts from the low resistance mode to the high resistance mode while the reset action means that the variable resistor element in the memory cell returns back from the high resistance mode to the low resistance mode.

The read action at the conventional device will first be explained. For reading data from the selected memory cell to be read, the action starts applying a read voltage (+Vread) to all the word lines, applying the read voltage (+Vread) to the unselected bit lines not connected to the selected memory cell, and applying 0 V to the selected bit line connected to the selected memory cell, as shown in FIG. 11 and Table 1. It is then judged from the measurement of a current in the word line whether the variable resistor element in each selected memory cell connected to the selected bit line is at the low resistance mode or the high resistance mode.

TABLE 1

|  | Selected memory cell | Unselected memory cell |
| --- | --- | --- |
| Word line voltage | +Vread | +Vread |
| Bit line voltage | 0 | +Vread |
| Voltage difference | +Vread | 0 |

The program action at the conventional device will then be explained. For programming data in selected one of the memory cells as a target of writing, the action starts applying a program voltage (+Vpp) to the selected word line connected to the selected memory cell, applying a voltage (+Vpp/2) to the unselected word lines not connected to the selected memory cell, applying a voltage (+Vpp/2) to the unselected bit lines not connected to the selected memory cell, and applying 0 V to the selected bit line connected to the selected memory cell, as shown in FIG. 12 and Table 2. This allows the selected memory cell to be applied with the program voltage +Vpp. Simultaneously, the unselected memory cells A along the selected word line and the unselected memory cells B along the selected bit line are applied with a voltage +Vpp/2 as a disturb voltage. It is common that the program voltage Vpp is determined so as not to permit its disturb voltage performing program action at the memory cell.

TABLE 2

|  | Selected memory cell | Unselected memory cell A | Unselected memory cell B | Unselected memory cell |
| --- | --- | --- | --- | --- |
| Word line voltage | +Vpp | +Vpp | +Vpp/2 | +Vpp/2 |
| Bit line voltage | 0 | +Vpp/2 | 0 | +Vpp/2 |
| Voltage difference | +Vpp | +Vpp/2 | +Vpp/2 | 0 |

The reset action at the conventional device will then be explained. For resetting the memory cells to be selected as a target of resetting, the action starts applying a reset voltage (+Vpp) to the selected bit line connected to the selected memory cell, applying a voltage (+Vpp/2) to the unselected word lines not connected to the selected memory cell, applying a voltage (+Vpp/2) to the unselected bit lines not connected to the selected memory cell, and applying 0 V to the selected word line connected to the selected memory cell, as shown in FIG. 13 and Table 3. This allows a reset voltage −Vpp to be applied to the selected memory cell. Simultaneously, a disturb voltage of −Vpp/2 is applied to the unselected memory cells A along the selected word line and the unselected memory cells B along the selected bit line. It is common that the reset voltage Vpp is determined so as not to permit its disturb voltage performing reset action at the memory cell.

TABLE 3

|  | Selected memory cell | Unselected memory cell A | Unselected memory cell B | Unselected memory cell |
|---|---|---|---|---|
| Word line voltage | 0 | 0 | +Vpp/2 | +Vpp/2 |
| Bit line voltage | +Vpp | +Vpp/2 | +Vpp | +Vpp/2 |
| Voltage difference | −Vpp | −Vpp/2 | −Vpp/2 | 0 |

In the program action at the conventional device, a voltage difference of +Vpp generated in the selected memory cell allows a current to flow into the selected memory cell. This causes Joule heat in the selected memory cell hence increasing the temperature of the variable resistor element in the selected memory cell. As the result, the variable resistor element is considered to shift from the low resistance mode to the high resistance mode.

However, the conventional device permits Joule heat generated in the selected memory cell 110 to conduct via the bit line 101 or the word line 103 to an adjacent unselected memory cell 111, as shown in FIG. 14. More particularly, as the bit line 101 and the word line 103 acts as a thermal diffusion path, the variable resistor element 102 in the unselected memory cell 111 will be increased in the temperature. In other words, the variable resistor element 102 in the unselected memory cell 111 will become highly variable in the resistance. Either the word line or the bit line is common to the memory cells adjacent to the selected memory cell and the selected memory cell. Since the disturb voltage is applied to the unselected memory cell 111, a change in the resistance in its variable resistance element will be encouraged by a combination of the disturbed voltage and Joule heat received from the adjacent selected memory cell thus resulting in a fault program action at the unselected memory cell 111.

SUMMARY OF THE INVENTION

In an aspect of the present invention, the foregoing drawback in the conventional device is eliminated by providing a nonvolatile memory device arranged in which the variable resistor element in its selected memory cell is varied in the resistance while the resistance of the variable resistor element in an unselected memory cell located adjacent to the selected memory cell is inhibited from being varied by preventing heat generated in the variable resistor element from diffusing to the outside of the selected memory cell.

A nonvolatile memory device according to an embodiment of the present invention is provided having a plurality of memory cells arranged in an array, each memory cell including a variable resistor element capable of storing data in accordance with a change in electrical resistance due to application of electrical stress, and characterized by a thermal diffusion barrier provided on a thermal diffusion path, wherein the thermal diffusion barrier is capable of suppressing a change in resistance of the variable resistor element due to heat diffusion from one of two adjacent memory cells separated by an electrical insulator from each other where heat is generated by applying the electrical stress for changing the electrical resistance of the variable resistor element to the other memory cell via the thermal diffusion path including an electrically conductive wiring material higher in thermal conductivity than that of the electrical insulator.

The nonvolatile memory device according to the present invention may be modified by comprising a memory cell array structure where the memory cells are arranged like a matrix in a row direction and column direction, and the memory cells along each row or column are electrically connected at one end to one another with the electrically conductive wiring material, and the thermal diffusion barrier which is lower in thermal conductivity than the wiring material and located between the wiring material and the memory cell.

The nonvolatile memory device according to the present invention may be modified by comprising a memory cell array structure where a plurality of memory cells are arranged like a matrix in a row direction and column direction, each memory cell including a variable resistor element capable of storing data in accordance with a change in electrical resistance due to application of electrical stress and the memory cells along each row or column are electrically connected at one end to one another with an electrically conductive wiring material and a thermal diffusion barrier which is lower in thermal conductivity than the wiring material and located between the wiring material and the memory cell.

The nonvolatile memory device according to the present invention may be modified by comprising a memory cell array structure where the memory cells along each row are electrically connected at one end to one another with a first wiring line made of the wiring material and the memory cells along each column are electrically connected at the other end to one another with a second wiring line made of the wiring material, and thermal diffusion barriers which are lower in thermal conductivity than the wiring material are located between the first wiring line and the memory cell and between the second wiring line and the memory cell respectively.

The nonvolatile memory device according to the present invention may be modified by comprising a memory cell array structure where the memory cells are arranged like a matrix in a row direction and column direction, and the memory cells along each row or column are electrically connected at one end to one another with the electrically conductive wiring material, wherein the wiring material is made of the thermal diffusion barrier.

The nonvolatile memory device according to the present invention may be modified by comprising a memory cell array structure where the memory cells along each row are electrically connected at one end to one another with a first wiring line made of the wiring material and the memory cells along each column are electrically connected at the other end to one another with a second wiring line made of the wiring material, wherein the wiring material of the first and second wiring lines is made of the thermal diffusion barrier.

The nonvolatile memory device according to the present invention may be modified in which the thermal conductivity TC (W/cm·K) and the specific resistance ρ (Ω·cm) of the thermal diffusion barriers are expressed respectively by $$TC \leq 7581.5 \times X^{1.0697} \quad (1)$$

and $$\rho \leq 1.25 \times 10^{-6} \times X^{-1} \quad (2)$$

where X (cm) is the thickness of the thermal diffusion barriers.

The nonvolatile memory device according to the present invention may be modified in which the variable resistance material of the variable resistance element contains transition metal oxide.

The nonvolatile memory device according to the present invention may be modified in which the variable resistance material of the variable resistance element contains chalcogenide.

The nonvolatile memory device according to the present invention may be modified in which the chalcogenide is germanium antimony tellurium (GeSbTe) alloy.

The nonvolatile memory device according to the present invention may be modified in which the memory cell includes a current limiter which has a function of limiting the current flowing through the variable resistor element.

The nonvolatile memory device according to the present invention may be modified in which the current limiter is a diode.

The nonvolatile memory device according to the present invention may be modified in which the diode is a PN junction diode or a schottky barrier diode.

The nonvolatile memory device according to the present invention may be modified in which the current limiter is a varistor.

The nonvolatile memory device according to the present invention may be modified in which the material of the varistor contains zinc oxide (ZnO) or strontium titanate ($SrTiO_3$) as a main component.

The nonvolatile memory device according to the present invention can suppress the diffusion of heat generated at the variable resistor element to the outside of the selected memory cell during the write action thus permitting no fault write action at any unselected memory cell located adjacent to the selected memory cell. Also, since the diffusion of heat is suppressed, the writing action at the selected memory cell can be increased in the efficiency. Accordingly, the program voltage applied to the selected memory can be decreased thus to minimize the current flowing through the selected memory cell during the program action of the selected memory cell.

FIG. 15A is a simulated profile of the temperature distribution between two adjacent memory cells in the nonvolatile memory device according to the present invention while FIG. 15B illustrates the same in the conventional device shown in FIG. 10. The nonvolatile memory device according to an inventive embodiment, unlike the conventional device, has the thermal diffusion barriers, which are 0.01 (W/cm·K) in thermal conductivity and 50 nm in thickness, disposed between the bit line and the memory cell and between the word line and the memory cell respectively. As apparent from the profile of FIG. 15, in the example nonvolatile memory device according to the present invention, even when the temperature of the variable resistor element in the selected memory cell is as high as about 920 K (647° C.), the variable resistor element in the adjacent unselected memory cell can remain at 300 K (27° C.) in temperature. In the conventional device, when the variable resistor element in the selected memory cell is at 920 K (647° C.) in temperature, the temperature of the variable resistor element in the adjacent unselected memory cell will be increased to 512 K (239° C.). It is therefore understood that the temperature in the adjacent unselected memory cell is effectively prevented from increasing by the presence of the thermal diffusion barriers which are lower in thermal conductivity than the bit lines and the word lines. The effect of suppressing the temperature rise in the adjacent memory cells can adjustably be controlled by modifying the thermal conductivity and the thickness of the thermal diffusion barriers.

DETAILED DESCRIPTION OF THE INVENTION

Some embodiments of a nonvolatile memory device according to the present invention (referred to as an inventive device hereinafter) will be described referring to the relevant drawings.

First Embodiment

Figure 1A:
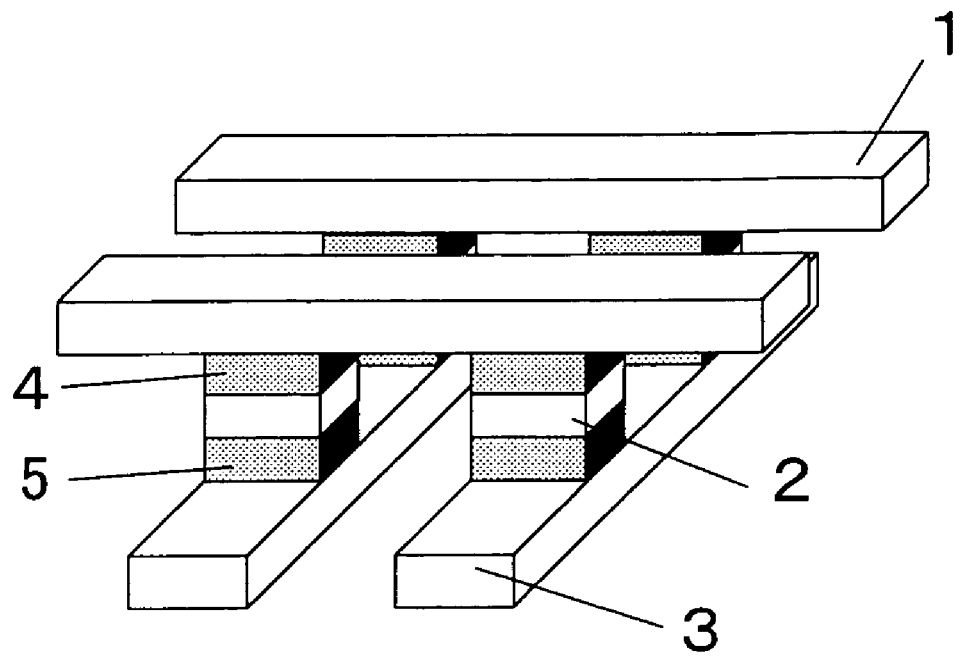
FIG. 1A is a perspective view of a primary part of the memory cell array in an inventive device showing the first embodiment of the present invention.
Figure 1B:
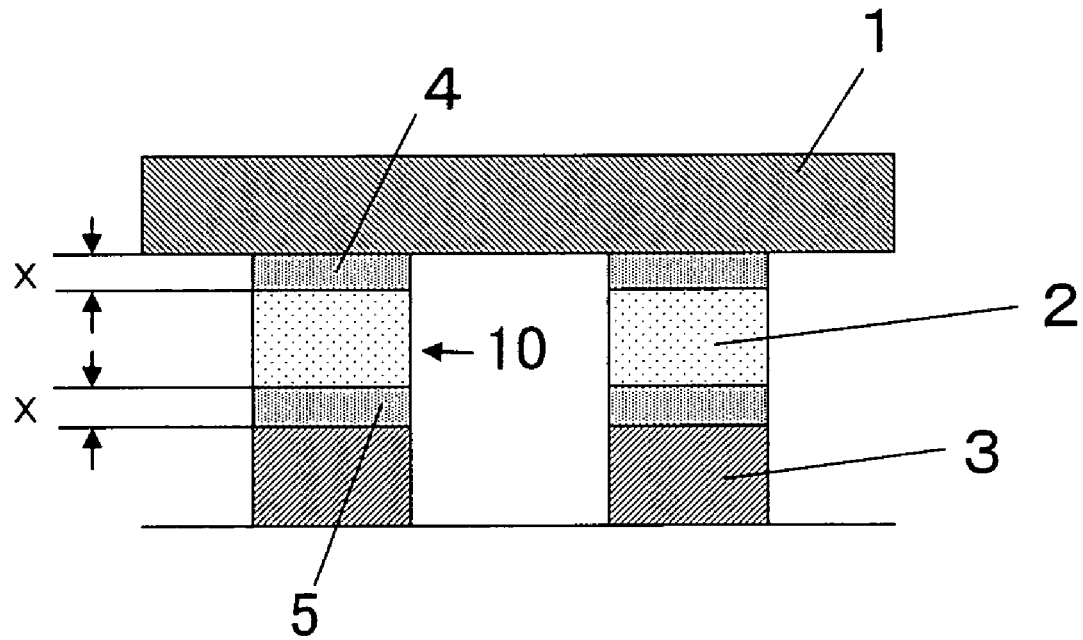
FIG. 1B is a cross sectional view taken along the vertical direction of the memory cell array shown in FIG. 1A.

FIG. 1A is a perspective view showing a primary part of a memory array cell structure in the inventive device of the first embodiment. FIG. 1B is a cross sectional view taken along the vertical of a memory cell array shown in FIG. 1A. In the drawings, each electrical insulator provided between any two adjacent memory cells is not illustrated for simplicity.

The memory cell array in the inventive device has multiple memory cells 10 arranged like a matrix in a row direction and column direction. The memory cells 10 at each column are electrically connected at one end with a thermal diffusion barrier 5 to a common word line 3. The memory cells 10 at each row are electrically connected at the other end with another thermal diffusion barrier 4 to a common bit line 1. Both the bit line 1 and the word line 3 are made of an electrically conductive wiring material. The wiring material may be aluminum (2.37 W/cm·K at thermal conductivity), copper (3.98 W/cm·K at thermal conductivity), and any other suitable material.

The memory cell 10 incorporates a variable resistor element 2. The variable resistor element 2 is provided for storage of data through modifying its electrical resistance with application of electrical stress. The material of the variable resistor element 2 may be selected from, for example, transition metal oxide and chalcogenide.

The transition metal oxide may preferably be a perovskite metal oxide. The perovskite metal oxide is expressed by the formula, $M'_x M''_{(1-x)} M_y O_z$, where M' is at least a metal selected from a group of La, Ce, Bi, Pr, Nd, Pm, Sm, Y, Sc, Yb, Lu, and Gd, M'' is at least a metal selected from a group of Mg, Ca, Sr, Ba, Pb, Zn, and Cd, and M is at least a metal selected from a group of Mn, Ce, V, Fe, Co, Nb, Ta, Cr, Mo, W, Zr, Hf, and Ni. Also, x, y, and z in the formula are defined by $0 \leq x \leq 1$, $0 \leq y \leq 2$, $1 \leq z \leq 7$.

The chalcogenide may preferably be germanium antimony tellurium (GeSbTe) alloy.

In the inventive device, the bit line 1 and the memory cell 10 are separated by the thermal diffusion barrier 4 while the word line 3 and the memory cell 10 are separated by the thermal diffusion barrier 5. Each memory cell 10 is directly connected between the thermal diffusion barriers.

The thermal diffusion barriers 4 and 5 are arranged low in thermal conductivity for suppressing the diffusion of heat from the variable resistor element 2 in a selected memory cell through the bit line 1 and the word line 3 to the outside during the program action in order to increase the efficiency of the write action and inhibit a fault write action over each adjacent unselected memory cell. Also, the thermal diffusion barriers 4 and 5 have a low level of specific resistance.

Figure 2:
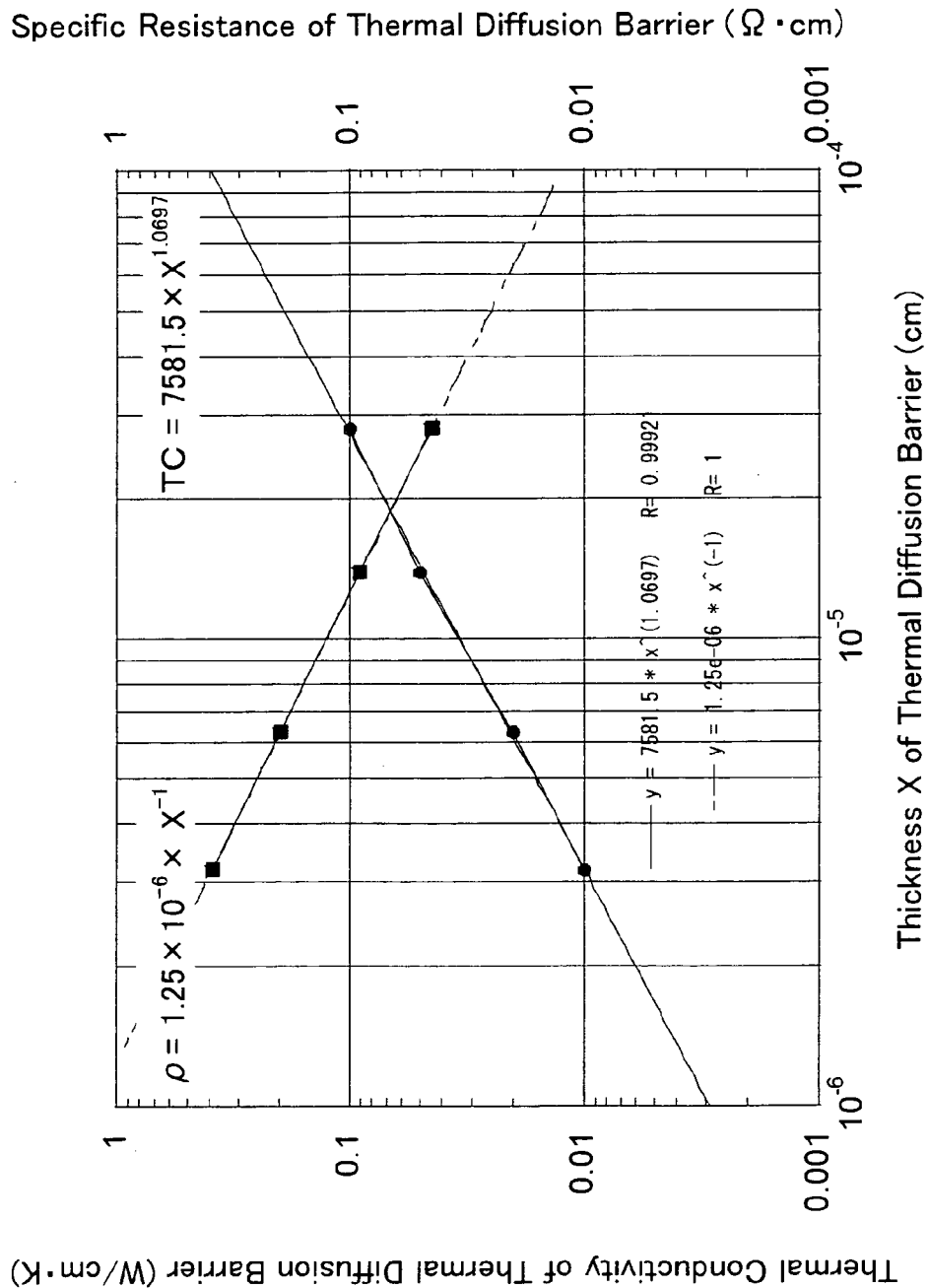
FIG. 2 illustrates a characteristic window of the thermal diffusion barrier.

The characteristic windows (including the thermal conductivity, the thickness, and the specific resistance) of the thermal diffusion barriers will now be explained (See FIG. 2). It is essential for attenuating the diffusion of heat towards the outside to lower the thermal conductivity and increase the thickness of the barriers. However, if their thickness is too great, the thermal diffusion barriers will unnegligibly be increased in electrical resistance. The higher the electrical resistance of the thermal diffusion barrier, the more a ratio of the effective resistance in the variable resistor element between the high mode and the low mode will be declined, hence interrupting the read action. It is therefore important to determine the thermal conductivity, the thickness, and the specific resistance at favorable settings.

For preventing the resistance in the variable resistor element from being negatively affected, the resistance in the thermal diffusion barriers is preferably not greater than 1% of the resistance of the variable resistor element. For example, when the resistance in the variable resistor element is about 50000Ω at the low mode, the resistance of the thermal diffusion barriers may preferably be not higher than 500Ω. It is hence desired that the specific resistance ρ (Ω·cm) satisfies the relationship at the following mathematical expression 3 when the thickness is X (cm) and the overall area of the thermal diffusion barriers is $25 \times 10^{-10}$ (cm$^2$). More particularly, the specific resistance ρ (Ω·cm) is determined, for example, at 300 K.

$$\rho \leq 1.25 \times 10^{-6} \times X^{-1} \quad (3)$$

It is also desired for permitting no change in the resistance of the variable resistor element in each unselected memory cell adjacent to the selected memory to maintain the temperature of the unselected memory cells at substantially 300 K during the program action or the period of applying a disturb voltage to the unselected memory cell. The temperature of the adjacent unselected memory cell depends on the thermal conductivity and the thickness of the thermal diffusion barriers. For example, when the thermal diffusion barriers are low in thermal conductivity, their thickness may be decreased. When the thermal diffusion barriers are relatively high in thermal conductivity, their thickness may be increased.

This requires the thermal conductivity of the thermal diffusion barriers to remain at such a level that the temperature of the unselected memory cell is substantially 300 K during the period of applying the disturb voltage to the unselected memory cell. It is hence desired that the thermal conductivity TC (W/cm·K) satisfies the relationship at the following mathematical expression 4 when the thickness of the thermal diffusion barriers is X (cm). More particularly, the thermal conductivity TC (W/cm·K) is determined, for example, at 300 K.

$$TC \leq 7581.5 \times X^{1.0697} \quad (4)$$

It is noted that the relationship at the mathematical expression 4 has been calculated from a series of simulations between the thermal conductivity TC and the thickness X of the thermal diffusion barriers which holds the temperature of the unselected memory cell at 300 K during the period of applying the disturb voltage to the unselected memory cell.

It is therefore desired that the specific resistance and the thermal conductivity of the thermal diffusion barriers satisfy the mathematical expressions 3 and 4 respectively.

The material of the thermal diffusion barriers 4 and 5 may be selected from, for example, manganese (Mn, 0.08 (W/cm·K) of the thermal conductivity and $1.39 \times 10^{-4}$ (Ω·cm) of the specific resistance at 300 K) and bismuth (Bi, 0.08 (W/cm·K) of the thermal conductivity and $1.16 \times 10^{-4}$ (Ω·cm) of the specific resistance at 300 K).

Figure 3:
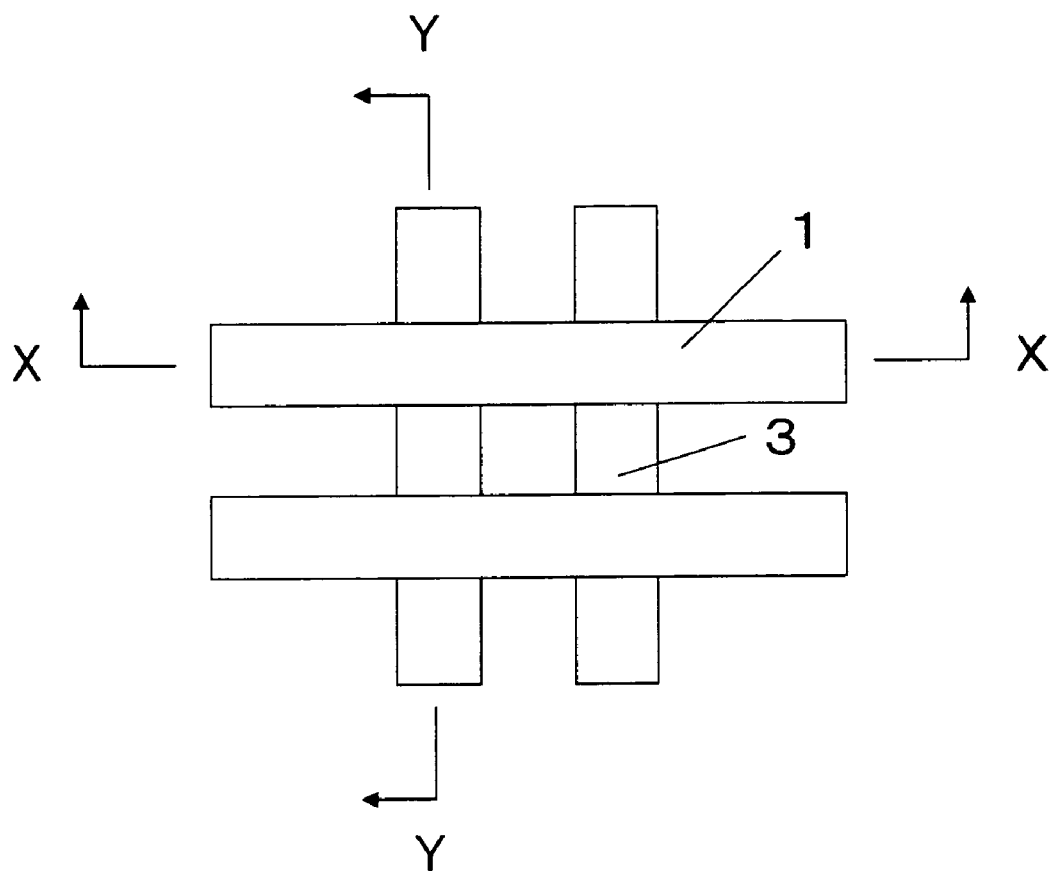
FIG. 3 is a plan view showing a part of the memory cell array.

A method of manufacturing the memory cell array of the embodiment will then be described. FIG. 3 is a plan view showing a part of the memory cell array. FIGS. 4A to 4F are cross sectional views taken along the lines X-X and Y-Y showing steps of the method of manufacturing the memory cell array.

(1) Preparatory Step

When transistors in a peripheral circuit have been fabricated, a film of silicon oxide is deposited to a thickness of, for example, 350 to 1000 nm to develop an interlayer insulating film.

The silicon oxide film is then planarized by a chemical-mechanical polishing (CMP) technique to develop an interlayer insulating layer (of electrical insulator).

Figure 4A:
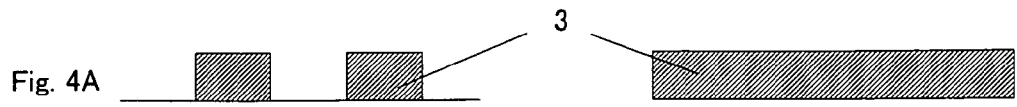
FIG. 4 is a cross sectional view taken along the line X-X and the line Y-Y, showing steps of manufacturing the memory cell array.

(2) Word Line Forming Step (See FIG. 4A)

Then, a layer of, for example, aluminum or copper is deposited to a thickness of 100 to 500 nm to develop a wiring layer. Using a photolithographic technique (for example, patterning a resist and etching a wiring material film to remove unwanted portions), the word lines 3 are patterned.

Figure 4B:
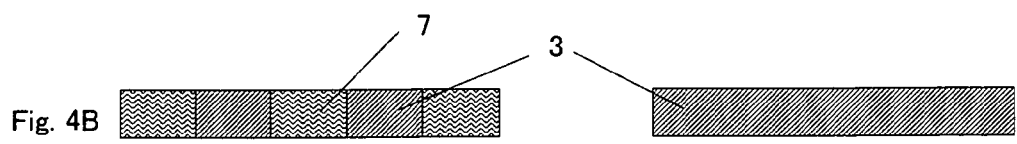

(3) Interlayer Insulating Layer Forming Step (See FIG. 4B)

Then, a film of silicon oxide is deposited to a thickness of, for example, 100 to 700 nm to develop an interlayer insulating film. The silicon oxide film is planarized by a CMP technique to develop an interlayer insulating layer 7.

Figure 4C:
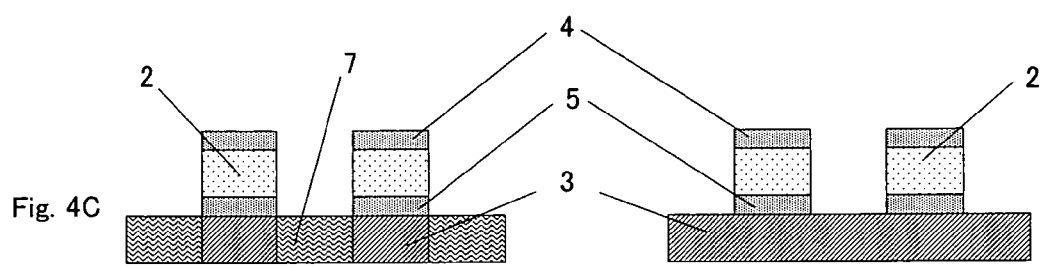

(4) Thermal Diffusion Barrier/Variable Resistor Element Forming Step (See FIG. 4C)

Then, a layer of a thermal diffusion barrier material is deposited to a thickness of 100 to 130 nm to develop a thermal diffusion barrier. In addition, a layer of a metal/transition metal oxide material or namely $Pt/Pr_{0.7}C_{0.3}MnO_3$ is deposited to a thickness of 10 to 300 nm to develop a variable resistance element layer. This is followed by depositing the thermal diffusion barrier material once more to a thickness of 100 to 130 nm to develop another thermal diffusion barrier. Using a photolithographic technique, the thermal diffusion barrier 5, the variable resistor element 2, and the thermal diffusion barrier 4 are then patterned. The thermal diffusion barrier material may be selected from, for example, manganese and bismuth.

Figure 4D:
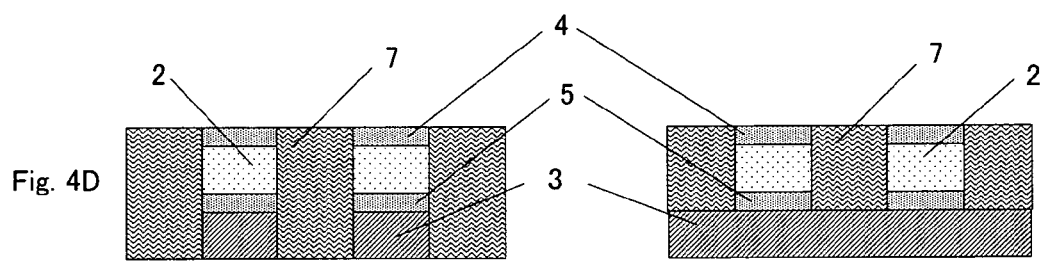

(5) Interlayer Insulating Layer Forming Step (See FIG. 4D)

Then, a film of silicon oxide is deposited to a thickness of, for example, 100 to 700 nm to develop an interlayer insulating film. The silicon oxide film is planarized by a CMP technique to develop an interlayer insulating layer 7.

Figure 4E:
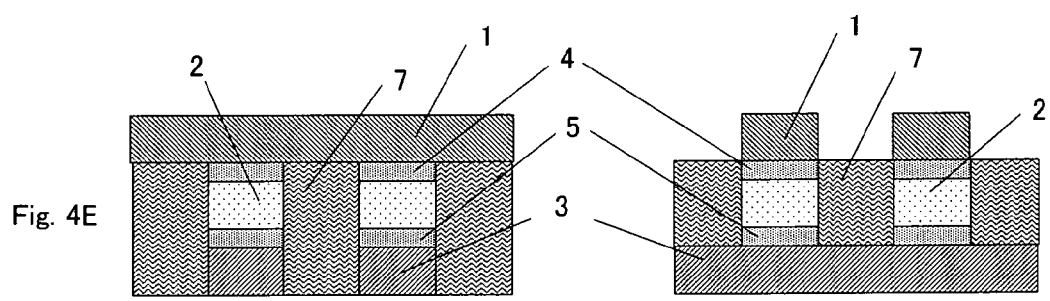

(6) Bit Line Forming Step (See FIG. 4E)

Then, a layer of, for example, aluminum or copper is deposited to a thickness of 100 to 500 nm to develop another wiring layer. Using a photolithographic technique, the bit lines 1 are patterned.

Figure 4F:
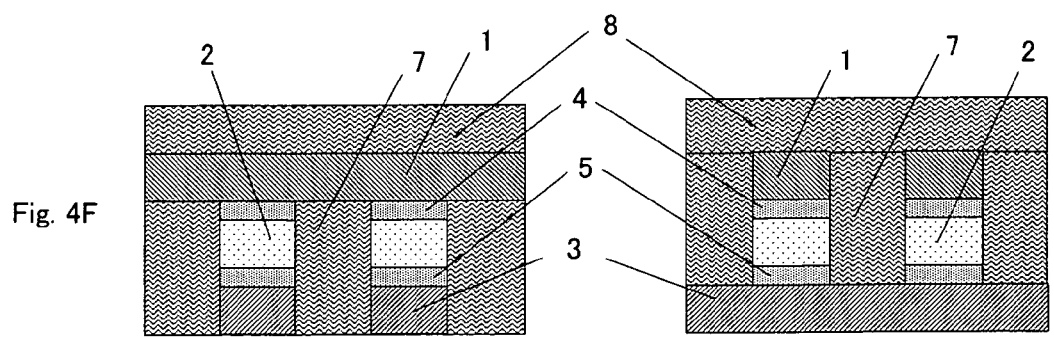

(7) Finishing Step (See FIG. 4F)

Finally, a layer of, for example, silicon oxide, silicon nitride, or BPSG (borophosphosilicate glass) is deposited to a thickness of 600 to 2000 nm to develop a protective layer 8. Using a CMP technique, the protective layer is planarized to finish a memory cell array of the embodiment.

Second Embodiment

Figure 5A:
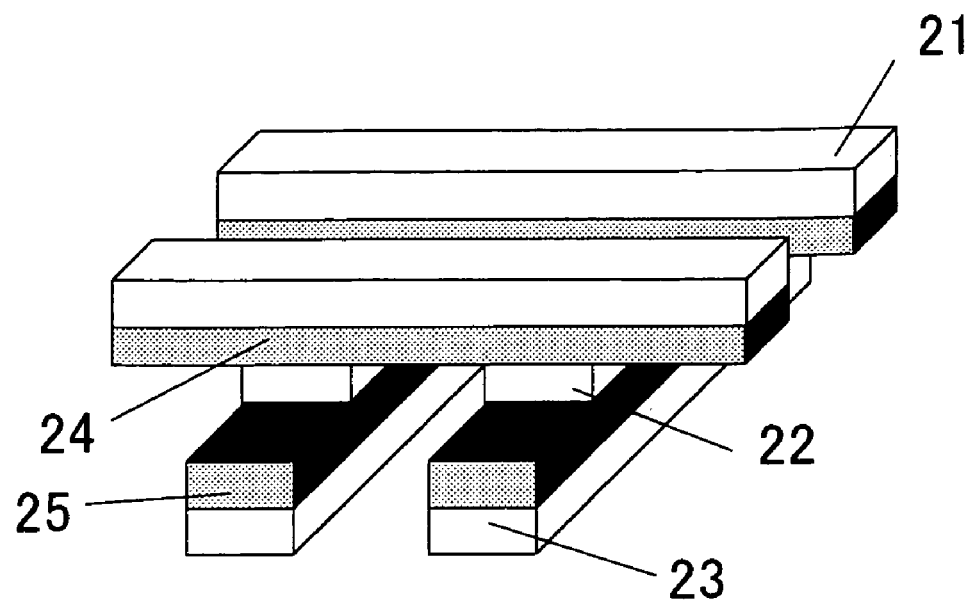
FIG. 5A is a perspective view of a primary part of the memory cell array in an inventive device showing the second embodiment of the present invention.
Figure 5B:
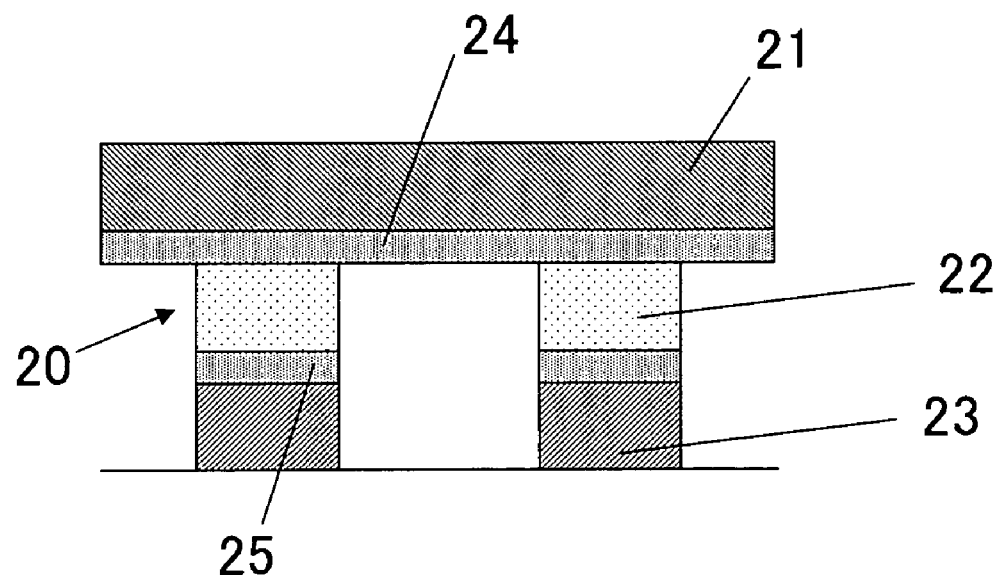
FIG. 5B is a cross sectional view taken along the vertical direction of the memory cell array shown in FIG. 5A.

FIG. 5A is a perspective view showing a primary part of a memory cell array structure in the inventive device of the second embodiment. FIG. 5B is a cross sectional view taken along the vertical of a memory cell array shown in FIG. 5A. The second embodiment is different from the first embodiment in the shape of the thermal diffusion barriers. Hence, the second embodiment will be explained mainly in relation to the shape of the thermal diffusion barriers. In the drawings, each electrical insulator provided between any two adjacent memory cells is not illustrated for simplicity.

The memory cell array in the inventive device has multiple memory cells 20 arranged like a matrix in a row direction and column direction. The memory cells 20 at each column are electrically connected at one end with a thermal diffusion barrier 25 to a common word line 23. The memory cells 20 at each row are electrically connected at the other end with another thermal diffusion barrier 24 to a common bit line 21. Both the bit line 21 and the word line 23 are made of the same electrically conductive wiring material as of the bit line 1 and the word line 3 in the first embodiment. The memory cell 20 incorporates a variable resistor element 22. The variable resistor element 22 is also made of the same variable resistor element material as of the variable resistor element 2 in the first embodiment and will be explained in no more detail.

In the inventive device, the bit line 21 and the memory cell 20 are separated by the thermal diffusion barrier 24 while the word line 23 and the memory cell 20 are separated by the thermal diffusion barrier 25. Particularly, the thermal diffusion barrier 24 extends linearly along the bit line 21 while the thermal diffusion barrier 25 extends linearly along the word line 23. The memory cells 20 at each column are commonly connected at one end the thermal diffusion barrier 25 while the memory cells 20 at each row are commonly connected at the other end to the thermal diffusion barrier 24. The arrangements other than the shape and the fabricating method of the thermal diffusion barriers 24 and 25 are identical to the thermal diffusion barriers 4 and 5 in the first embodiment and will be explained in no more detail.

A method of manufacturing the memory cell array of the second embodiment will then be described. FIGS. 6A to 6F are cross sectional views taken along the lines X-X and Y-Y showing steps of the method of manufacturing the memory cell array. The position of the cross section surface in the cross sectional views taken along the lines X-X and Y-Y is similar to that used for explaining the method of the first embodiment.

(1) Preparatory Step

When transistors in a peripheral circuit have been fabricated, a layer of silicon oxide is deposited to a thickness of, for example, 350 to 1000 nm to develop an interlayer insulating layer. The silicon oxide layer is then planarized by a CMP technique to develop an interlayer insulating layer (of electrical insulator).

Figure 6A:
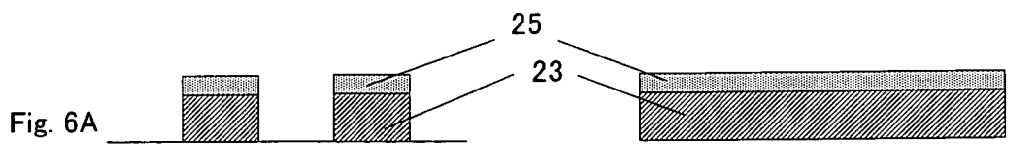
FIG. 6 is a cross sectional view taken along the line X-X and the line Y-Y, showing steps of manufacturing the memory cell array.

(2) Word Line/Thermal Diffusion Barrier Forming Step (See FIG. 6A)

Then, a layer of, for example, aluminum or copper is deposited to a thickness of 100 to 500 nm to develop a wiring layer. This is followed by depositing a thermal diffusion barrier material to develop a thermal diffusion barrier at a thickness of 100 to 130 nm. The thermal diffusion barrier material may be selected from, for example, manganese and bismuth. Using a photolithographic technique, the word lines 23 and the thermal diffusion barrier 25 are patterned.

Figure 6B:
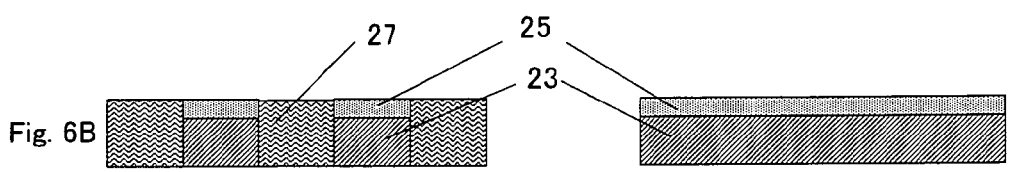

(3) Interlayer Insulating Layer Forming Step (See FIG. 6B)

Then, a layer of silicon oxide is deposited to a thickness of, for example, 100 to 700 nm to develop an interlayer insulating layer. The silicon oxide layer is planarized by a CMP technique to develop an interlayer insulating layer 27.

Figure 6C:
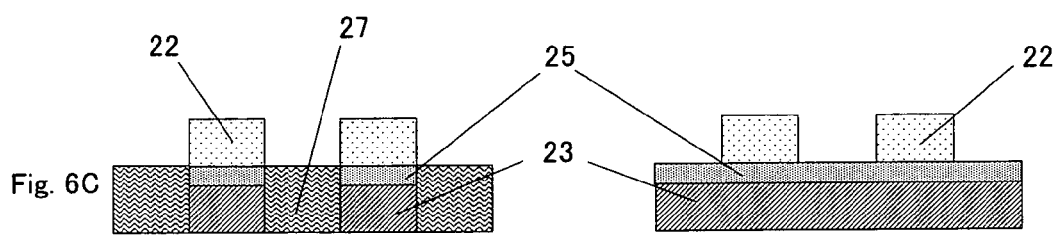

(4) Variable Resistor Element Forming Step (See FIG. 6C)

Then, a layer of a metal/transition metal oxide/metal or namely $Pt/Pr_{0.7}C_{0.3}MnO_3/Pt$ is deposited to a thickness of 10 to 300 nm to develop a variable resistance element layer. In addition, a layer of a thermal diffusion barrier material is deposited to a thickness of 100 to 130 nm to develop a thermal diffusion barrier. The thermal diffusion barrier material may be selected from, for example, manganese and bismuth. Using a photolithographic technique, the variable resistor element 22 is then patterned.

Figure 6D:
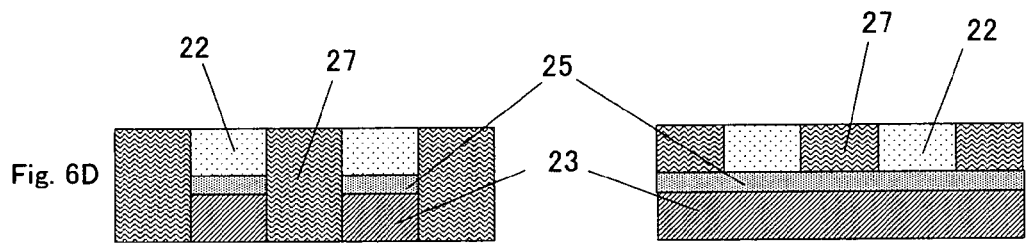

(5) Interlayer Insulating Layer Forming Step (See FIG. 6D)

Then, a layer of silicon oxide is deposited to a thickness of, for example, 100 to 700 nm to develop an interlayer insulating layer. The silicon oxide layer is planarized by a CMP technique to develop an interlayer insulating layer 27.

Figure 6E:
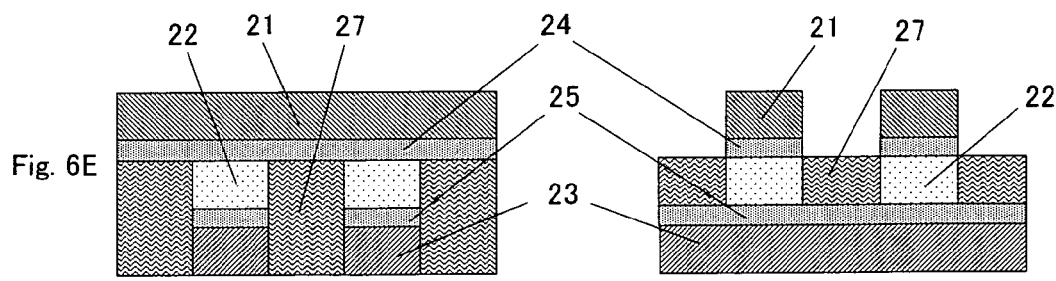

(6) Thermal Diffusion Barrier/Bit Line Forming Step (See FIG. 6E)

Then, a layer of a thermal diffusion barrier material is deposited to a thickness of 100 to 130 nm to develop another thermal diffusion barrier. The thermal diffusion barrier material may be selected from, for example, manganese and bismuth. Moreover, a layer of, for example, aluminum or copper is deposited to a thickness of 100 to 500 nm to develop another wiring layer. Using a photolithographic technique, the thermal diffusion barrier 24 and the bit lines 21 are patterned.

Figure 6F:
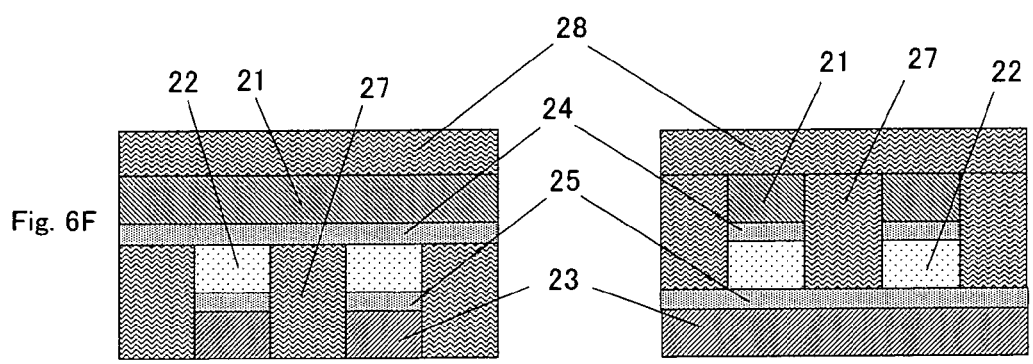

(7) Finishing Step (See FIG. 6F)

Finally, a layer of, for example, silicon oxide, silicon nitride, or BPSG is deposited to a thickness of 600 to 2000 nm to develop a protective layer 28. Using a CMP technique, the protective layer is planarized to finish a memory cell array of the second embodiment.

According to the method of the second embodiment, the thermal diffusion barrier serves as an etching stopper layer thus protecting the word lines from being over-etched and permitting no increase in the resistance of the word lines.

Third Embodiment

Figure 7A:
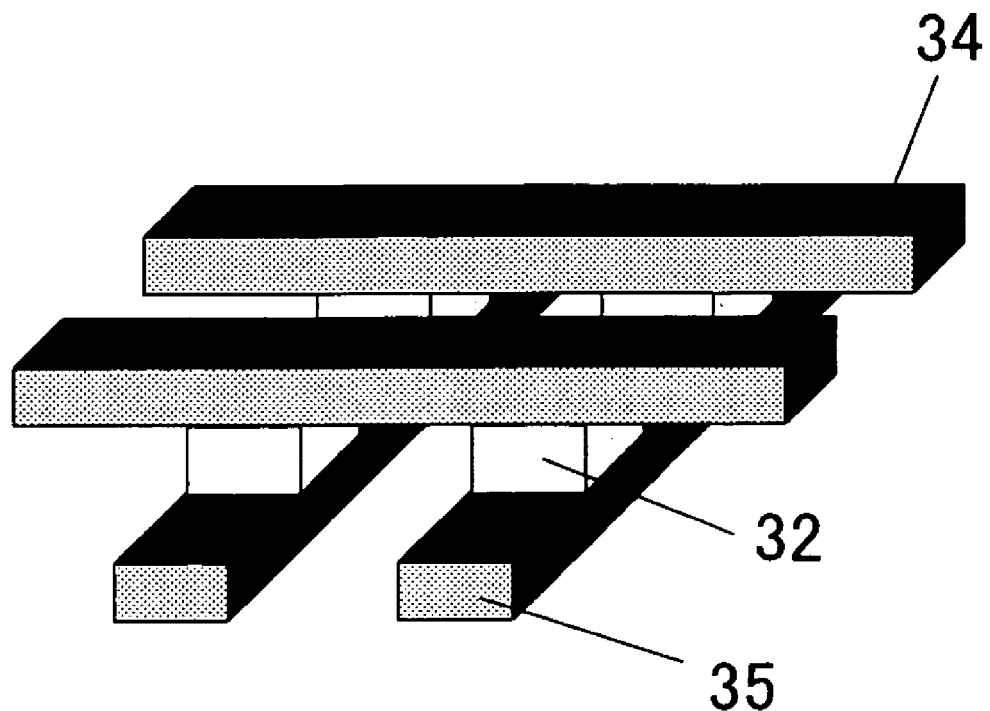
FIG. 7A is a perspective view of a primary part of the memory cell array in an inventive device showing the third embodiment of the present invention.
Figure 7B:
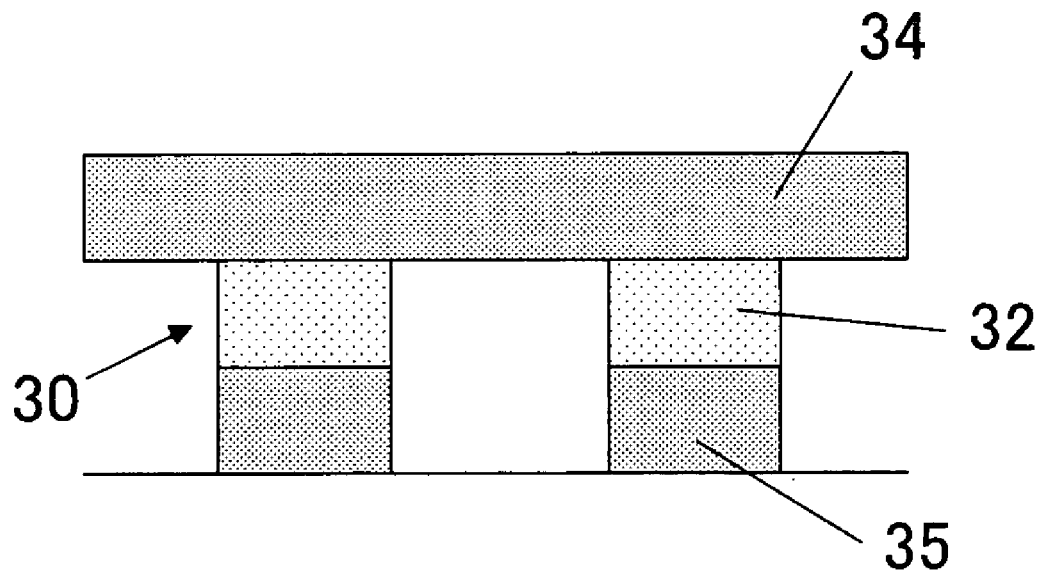
FIG. 7B is a cross sectional view taken along the vertical direction of the memory cell array shown in FIG. 7A.

FIG. 7A is a perspective view showing a primary part of a memory array cell structure in the inventive device of the third embodiment. FIG. 7B is a cross sectional view taken along the vertical of a memory cell array shown in FIG. 7A. In the drawings, each electrical insulator provided between any two adjacent memory cells is not illustrated for simplicity.

The memory cell array in the inventive device has multiple memory cells 30 arranged like a matrix in a row direction and column direction. The memory cells 30 at each column are electrically connected at one end to a common word line incorporating the thermal diffusion barrier 35. The memory cells 30 at each row are electrically connected at the other end to a common bit line incorporating the thermal diffusion barrier 34. In other words, the bit line 21 and the thermal diffusion barrier 24 in the second embodiment are modified as made of one thermal diffusion barrier material. Also, the word line 23 and the thermal diffusion barrier 25 in the second embodiment are modified as made of one thermal diffusion barrier material. The thermal diffusion barrier material may be selected from, for example, manganese and bismuth.

The memory cell 30 incorporates a variable resistor element 32. The variable resistor element 32 is also made of the same variable element material as of the variable resistor element 2 in the first embodiment and will be explained in no more detail.

The thermal diffusion barriers 34 and 35 are provided for suppressing the diffusion of heat from the variable resistor element 32 through themselves 34 and 35 to the outside during the program action in order to increase the efficiency of the write action and inhibit a fault write action over each adjacent unselected memory cell and thus arranged low in thermal conductivity. Also, the thermal diffusion barriers 34 and 35 have a low level of specific resistance so as to serve as a wiring material.

A method of manufacturing the memory cell array of the third embodiment will then be described. FIGS. 8A to 8F are cross sectional views taken along the lines X-X and Y-Y showing steps of the method of manufacturing the memory cell array. The position of the cross section surface in the cross sectional views taken along the lines X-X and Y-Y is similar to that used for explaining the method of the first embodiment.

(1) Preparatory Step

When transistors in a peripheral circuit have been fabricated, a layer of silicon oxide is deposited to a thickness of, for example, 350 to 1000 nm to develop an interlayer insulating layer. The silicon oxide layer is then planarized by a CMP technique to develop an interlayer insulating layer (of electrical insulator).

Figure 8A:
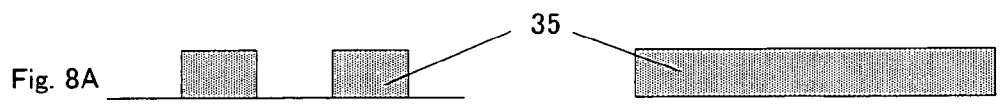
FIG. 8 is a cross sectional view taken along the line X-X and the line Y-Y, showing steps of manufacturing the memory cell array.

(2) Thermal Diffusion Barrier Forming Step (See FIG. 8A)

Then, a layer of a thermal diffusion barrier material is deposited to 10 to 130 nm to develop a thermal diffusion barrier. Using a photolithographic technique, the thermal diffusion barrier 35 is patterned. The thermal diffusion barrier material may be selected from, for example, manganese and bismuth.

Figure 8B:
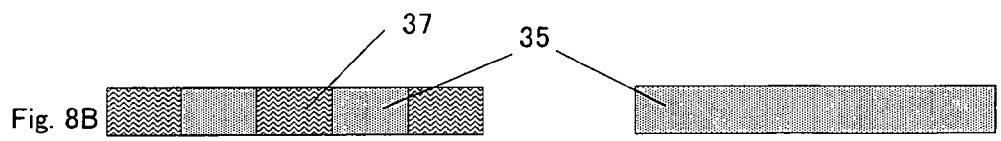

(3) Interlayer Insulating Layer Forming Step (See FIG. 8B)

Then, a layer of silicon oxide is deposited to a thickness of, for example, 100 to 700 nm to develop an interlayer insulating layer. The silicon oxide layer is planarized by a CMP technique to develop an interlayer insulating layer 37.

Figure 8C:
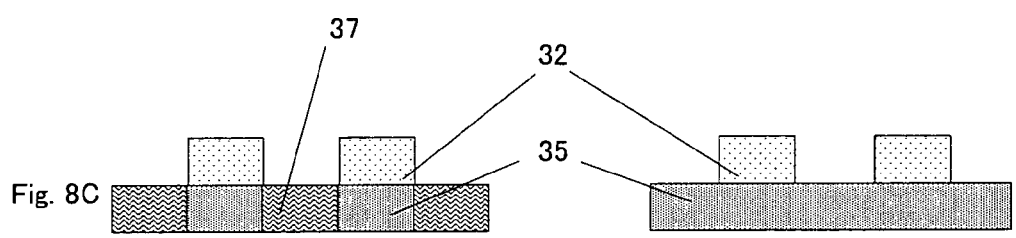

(4) Variable Resistor Element Forming Step (See FIG. 8C)

Then, a layer of a thermal diffusion barrier material is deposited to a thickness of 100 to 130 nm to develop a thermal diffusion barrier. In addition, a layer of a metal/transition metal oxide/metal or namely $Pt/Pr_{0.7}C_{0.3}MnO_3$ is deposited to a thickness of 10 to 300 nm to develop a variable resistance element layer. Using a photolithographic technique, the variable resistor element 32 is then patterned.

Figure 8D:
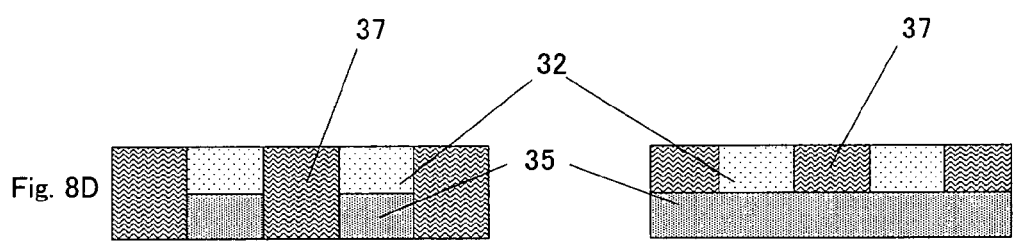

(5) Interlayer Insulating Layer Forming Step (See FIG. 8D)

Then, a layer of silicon oxide is deposited to a thickness of, for example, 100 to 700 nm to develop an interlayer insulating layer. The silicon oxide layer is planarized by a CMP technique to develop an interlayer insulating layer 37.

Figure 8E:
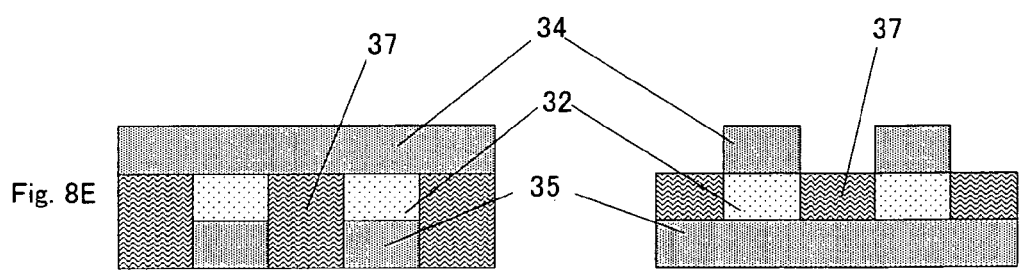

(6) Thermal Diffusion Barrier Forming Step (See FIG. 8E)

Then, a layer of a thermal diffusion barrier material is deposited to a thickness of 10 to 130 nm to develop another thermal diffusion barrier. Using a photolithographic technique, the thermal diffusion barrier 34 is patterned. The thermal diffusion barrier material may be selected from, for example, manganese and bismuth.

Figure 8F:
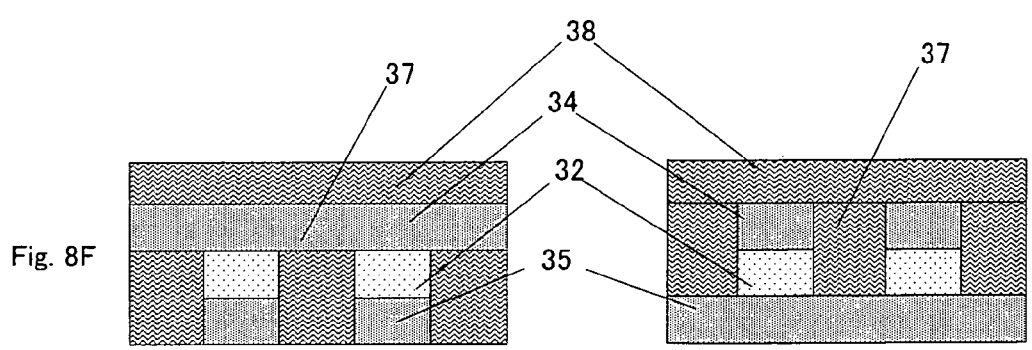

(7) Finishing Step (See FIG. 8F)

Finally, a layer of, for example, silicon oxide, silicon nitride, or BPSG is deposited to a thickness of 600 to 2000 nm to develop an interlayer insulating layer. Using a CMP technique, the insulating layer is planarized to finish a memory cell array of the third embodiment.

Fourth Embodiment

Figure 9A:
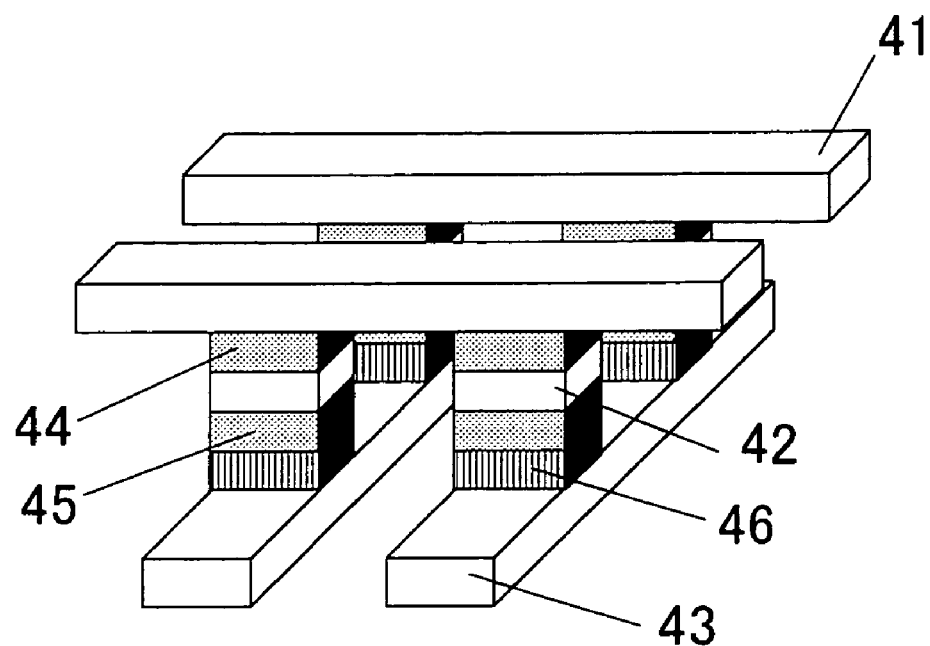
FIG. 9A is a perspective view of a primary part of the memory cell array in an inventive device showing the fourth embodiment of the present invention.
Figure 9B:
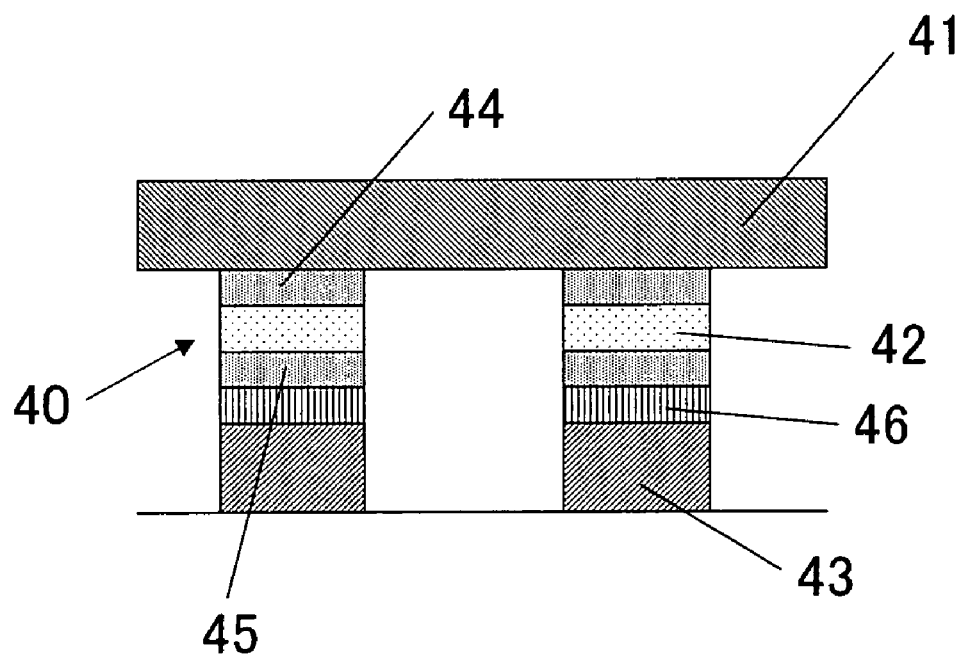
FIG. 9B is a cross sectional view taken along the vertical direction of the memory cell array shown in FIG. 9A.
Figure 10A:
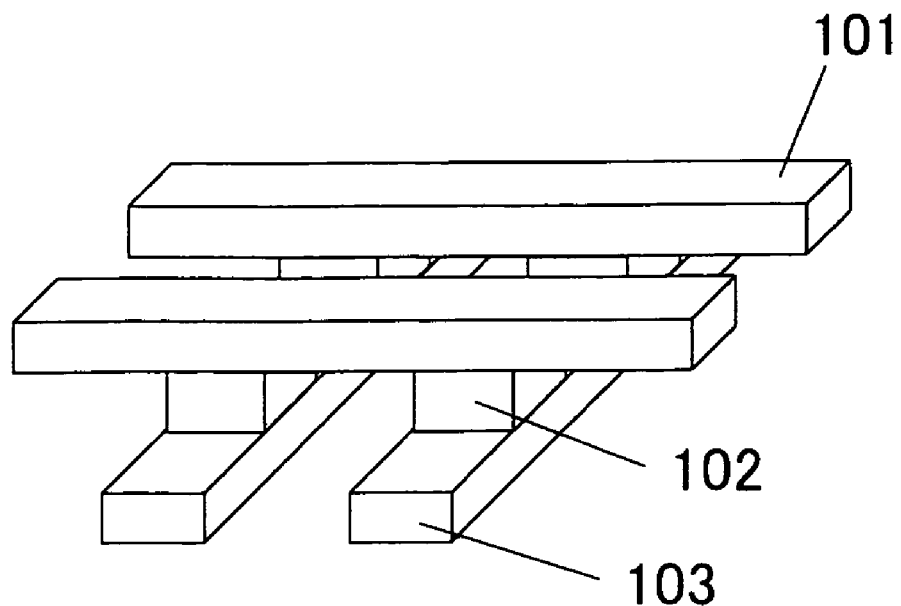
FIG. 10A is a perspective view of a part of the circuit in a conventional device.
Figure 10B:
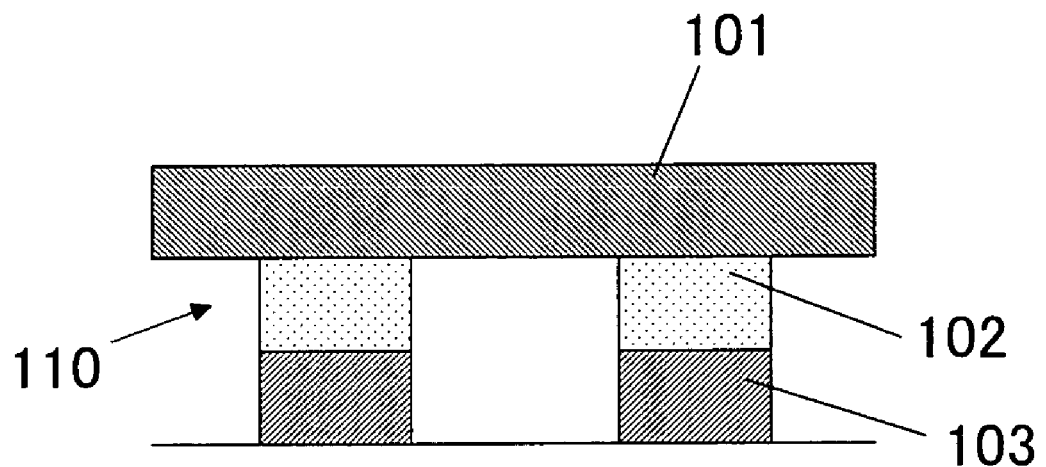
FIG. 10B is a cross sectional view taken along the vertical direction of the conventional device shown in FIG. 10A.
Figure 11:
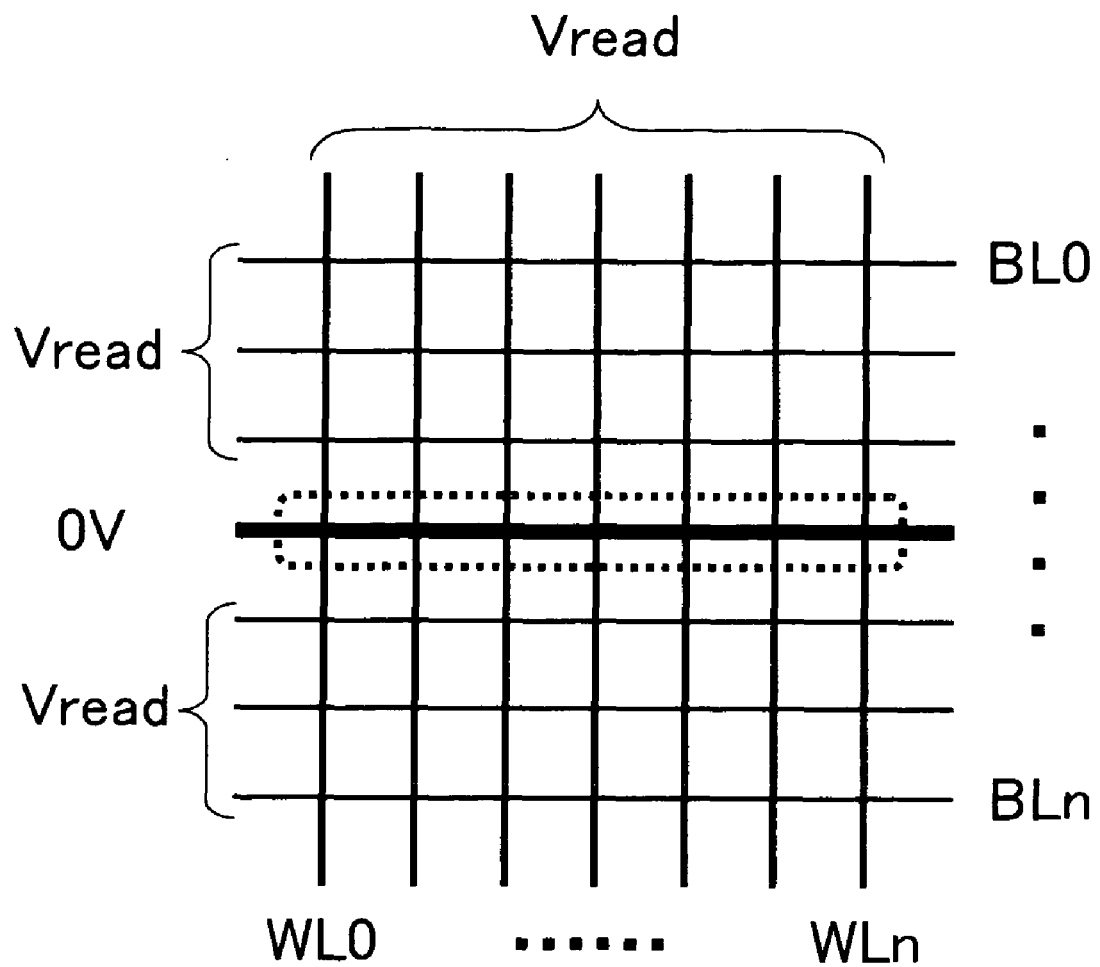
FIG. 11 is a schematic view of the memory cell array in the conventional device at its read action.
Figure 12:
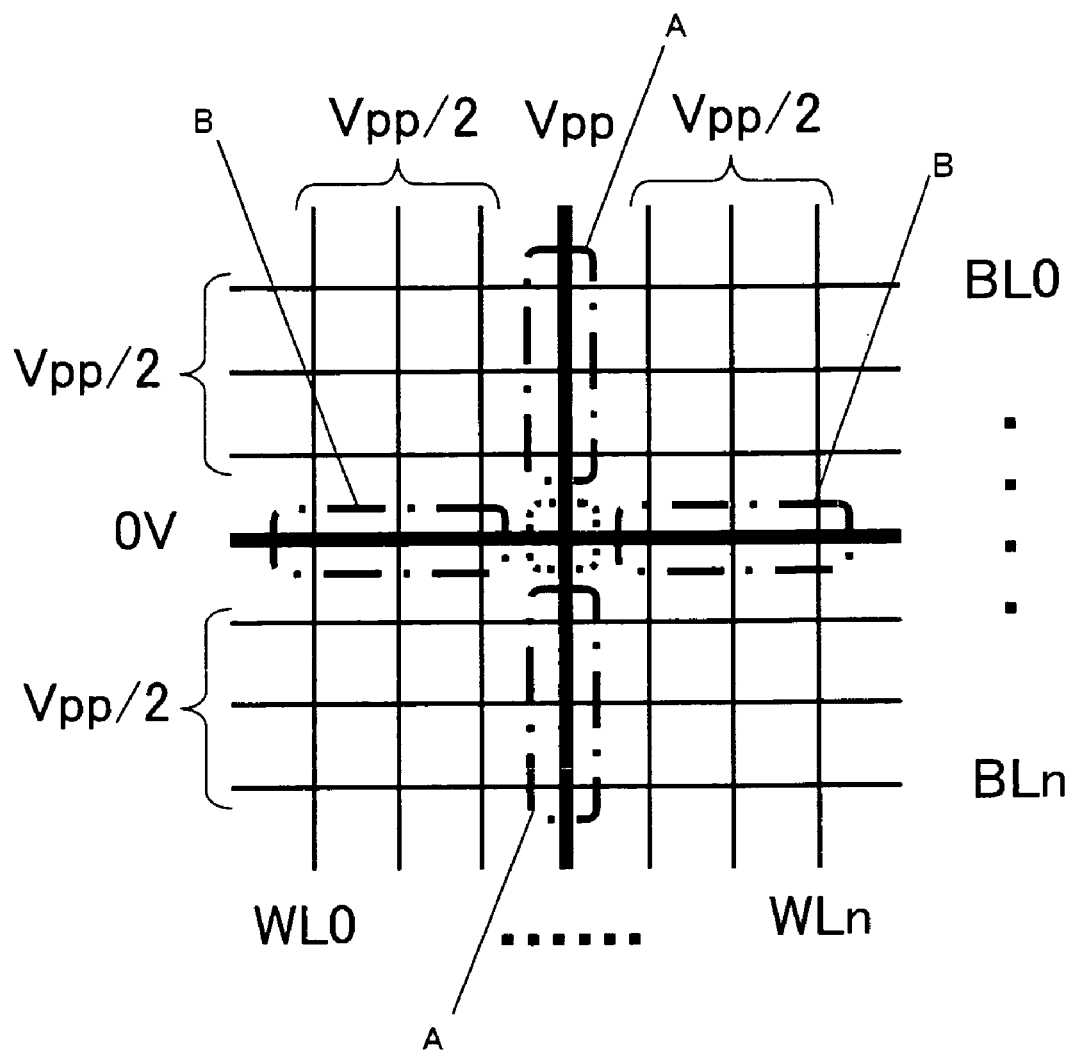
FIG. 12 is a schematic view of the memory cell array in the conventional device at its program action.
Figure 13:
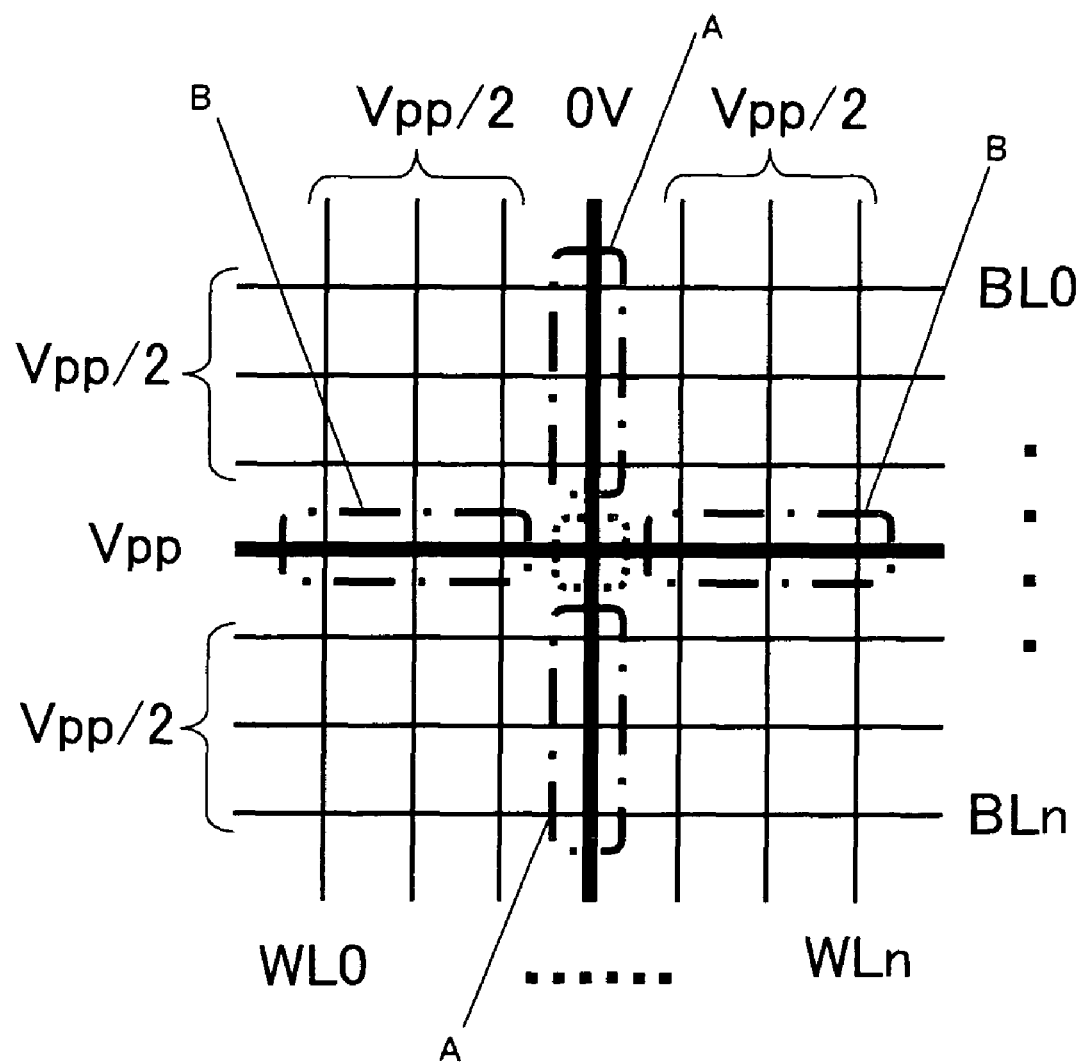
FIG. 13 is a schematic view of the memory cell array in the conventional device at its reset action.
Figure 14:
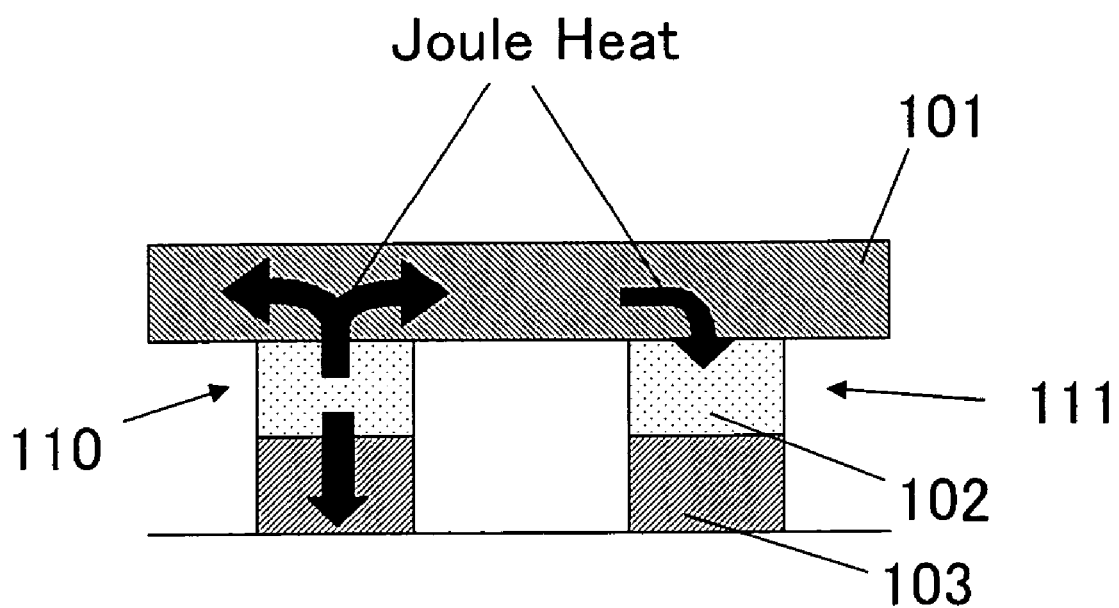
FIG. 14 is a view showing diffusion of Joule heat generated in the selected memory cell to an adjacent unselected memory cell.
Figure 15B:
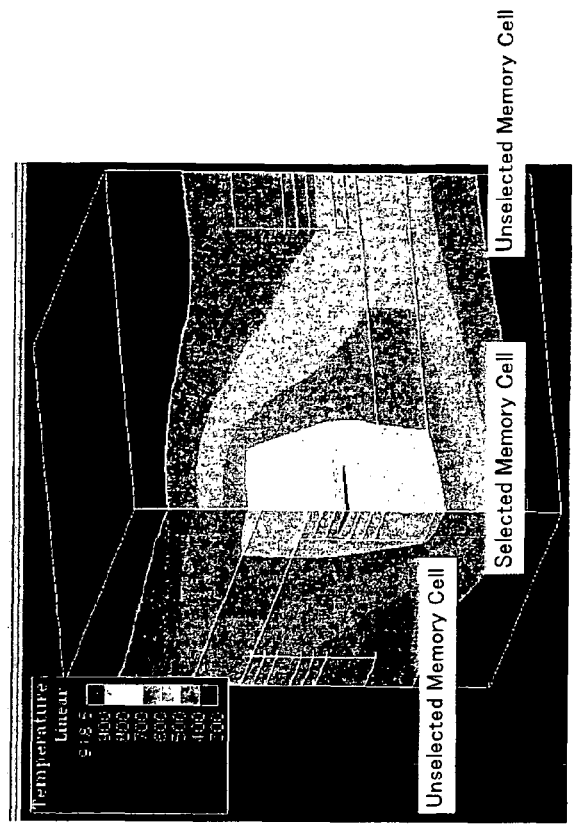
FIG. 15B is a profile of the temperature distribution in a conventional device.
Figure 15A:
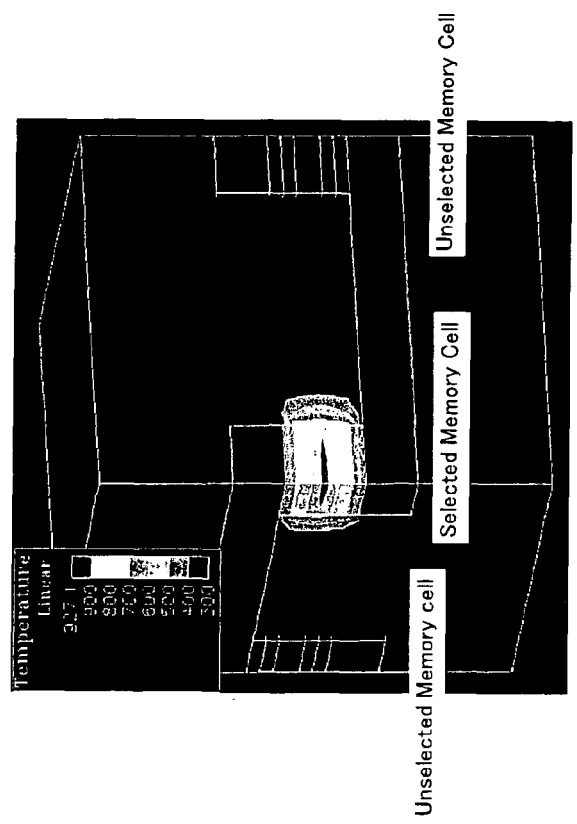
FIG. 15A is a profile of the temperature distribution in a nonvolatile memory device according to the present invention.

FIG. 9A is a perspective view showing a primary part of a memory cell array structure in the inventive device of the fourth embodiment. FIG. 9B is a cross sectional view taken along the vertical of the inventive device shown in FIG. 9A. The fourth embodiment is different from the first embodiment in that a variable resistor element 42 in each memory cell 40 is provided with a current limiter element 46 in series. Hence, the fourth embodiment will be explained mainly in relation to the current limiter element 46.

The memory cell array in the inventive device has multiple memory cells 40 arranged like a matrix in a row direction and column direction. The memory cells 40 at each column are electrically connected at one end with a thermal diffusion barrier 45 to a common word line 43. The memory cells 40 at each row are electrically connected at the other end with another thermal diffusion barrier 44 to a common bit line 41. Both the bit line 41 and the word line 43 are made of the same electrically conductive wiring material as of the bit line 1 and the word line 3 in the first embodiment. The memory cell 40 incorporates a variable resistor element 42. The variable resistor element 42 is also made of the same variable resistor element material as of the variable resistor element 2 in the first embodiment and will be explained in no more detail.

In the inventive device, the bit line 41 and the memory cell 40 are separated by the thermal diffusion barrier 44 while the word line 43 and the memory cell 40 are separated by the thermal diffusion barrier 45. The thermal diffusion barriers 44 and 45 are identical to the thermal diffusion barriers 4 and 5 in the first embodiment and will be explained in no more detail.

The inventive device comprises the current limiter element 46 between the word line 43 and the thermal diffusion barrier 45 in each memory cell for limiting the current which flows in the variable resistor element 42.

The current limiter element may be implemented by a diode or a varistor employed for protecting the device from any surge current. The diode is preferably selected from a PN diode having a p-type semiconductor and an n-type semiconductor joined to each other and a schottky barrier diode having a schottky effect at the junction between metal and semiconductor used for rectifying. The varistor is preferably selected from a ZnO varistor formed by sintering zinc oxide (ZnO) with small amounts of metal oxide such as bismuth oxide ($Bi_2O_3$) and an $SrTiO_3$ varistor.

According to the fourth embodiment, the current limiter element can further minimize any change in the resistance of the variable resistor element caused by the disturb voltage during the program action or read action over the memory cell. The installation of the current limiter element is not limited to between the word line 43 and the thermal diffusion barrier 45 but may be between the variable resistor element 42 and the thermal diffusion barrier 45, between the variable resistor element 42 and the thermal diffusion barrier 44, or between the thermal diffusion barrier 44 and the bit line 41.

Other Embodiments (1) Although the memory cell array of each of the foregoing embodiments is provided in a single layer structure, it may be implemented in a multi-layer structure with equal success thus ensuring the effect of attenuating the temperature increase in the adjacent memory cells.

(2) Although the variable resistor element in each of the foregoing embodiments is provided in a multi-layer structure of metal layers and variable resistor material layers (of a transition metal oxide), its material may be implemented in a single layer structure.

(3) Although each memory cell of the fourth embodiment is provided with the current limiter element in series with the variable resistor element, it may be replaced by a transistor arranged for selecting the memory cell, which can provide with equal success the effect of attenuating the temperature increase in the adjacent memory cells.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile memory device, comprising:
a plurality of memory cells arranged in an array, each memory cell including a variable resistor element capable of storing data in accordance with a change in electrical resistance due to application of electrical stress,
a thermal diffusion barrier on a thermal diffusion path, wherein
the thermal diffusion barrier is capable of suppressing a change in resistance of the variable resistor element due to heat diffusion from one of two adjacent memory cells separated by an electrical insulator from each other where heat is generated by applying the electrical stress for changing the electrical resistance of the variable resistor element to the other memory cell via the thermal diffusion path including an electrically conductive wiring material higher in thermal conductivity than that of the electrical insulator; and
a memory cell array structure where the memory cells are arranged like a matrix in a row direction and column direction, and the memory cells along each row or column are electrically connected at one end to one another with the electrically conductive wiring material, wherein
the thermal diffusion barrier which is lower in thermal conductivity than the electrically conductive wiring material is located between the electrically conductive wiring material and the memory cell, and the thermal conductivity TC (W/cm·K) of the thermal diffusion barrier is expressed by $$TC \leq 7581.5 \times X^{1.0697} \qquad (1)$$

where X (cm) is a thickness of the thermal diffusion barrier.

2. The nonvolatile memory device according to claim 1, comprising:
a memory cell array structure where the memory cells along each row are electrically connected at one end to one another with a first wiring line made of the elect all conductive wiring material and the memory cells along each column are electrically connected at the other end to one another with a second wiring line made of the electrically conductive wiring material; and
thermal diffusion barriers which are lower in thermal conductivity than the electrically conductive wiring material and located between the first wiring line and the memory cell and between the second wiring line and the memory cell respectively.

3. The nonvolatile memory device according to claim 1, comprising
a memory cell array structure where the memory cells are arranged like a matrix in a row direction and column direction, and the memory cells along each row or column are electrically connected at one end to one another with the electrically conductive wiring material, wherein
the electrically conductive wiring material is made of the thermal diffusion barrier.

4. The nonvolatile memory device according to claim 3, comprising
a memory cell array structure where the memory cells along each row are electrically connected at one end to one another with a first wiring line made of the electrically conductive wiring material and the memory cells along each column are electrically connected at the other end to one another with a second wiring line made of the electrically conducive wiring material, wherein
the electrically conductive wiring material of the first and second wiring lines is made of the thermal diffusion barrier.

5. The nonvolatile memory device according to claim 1, wherein
the specific resistance ρ (Ω·cm) of the thermal diffusion barrier is expressed by $$\rho \leq 1.25 \times 10^{-6} \times X^{-1} \qquad (2)$$

where X (cm) is a thickness of the thermal diffusion barrier.

6. The nonvolatile memory device according to claim 1, wherein a variable resistance material of the variable resistance element contains transition metal oxide.

7. The nonvolatile memory device according to claim 1, wherein a variable resistance material of the variable resistance element contains chalcogenide.

8. The nonvolatile memory device according to claim 7, wherein the chalcogenide is germanium antimony tellurium (GeSbTe) alloy.

9. The nonvolatile memory device according to claim 1, wherein the memory cell includes a current limiter which has a function of limiting a current flowing through the variable resistor element.

10. The nonvolatile memory device according to claim 9, wherein the current limiter is a diode.

11. The nonvolatile memory device according to claim 10, wherein the diode is a PN junction diode or a schottky barrier diode.

12. The nonvolatile memory device according to claim 9, wherein the current limiter is a varistor.

13. The nonvolatile memory device according to claim 12, wherein a material of the varistor contains zinc oxide (ZnO) or strontium titanate ($SrTiO_3$) as a main component.

14. A nonvolatile memory device, comprising:
a memory cell array structure where a plurality of memory cells are arranged like a matrix in a row direction and column direction, each memory cell including a variable resistor element capable of storing data in accordance with a change in electrical resistance due to application of electrical stress and the memory cells along each row or column are electrically connected at one end to one another with an electrically conductive wiring material; and
a thermal diffusion barrier which is lower in thermal conductivity than the electrically conductive wiring material and located between the electrically conductive wiring material and the memory cell, wherein
thermal conductivity TC (W/cm·K) of the thermal diffusion barrier is expressed by $$TC \leq 7581.5 \times X^{1.0697} \quad (1)$$

where X (cm) is a thickness of the thermal diffusion barrier.

15. The nonvolatile memory device according to claim 14, comprising:
a memory cell array structure where the memory cells along each row are electrically connected at one end to one another with a first wiring line made of the electrically conductive wiring material and the memory cells along each column are electrically connected at the other end to one another with a second wiring line made of the electrically conductive wiring material; and
thermal diffusion barriers which are lower in thermal conductivity than the electrically conductive wiring material are located between the first wiring line and the memory cell and between the second wiring line and the memory cell respectively.

16. The nonvolatile memory device according to claim 14, wherein
the specific resistance ρ (Ω·cm) of the thermal diffusion barrier is expressed by $$\rho \leq 1.25 \times 10^{-6} \times X^{-1} \quad (2)$$

where X (cm) is a thickness of the thermal diffusion barrier.

17. The nonvolatile memory device according to claim 14, wherein a variable resistance material of the variable resistance element contains transition metal oxide.

18. The nonvolatile memory device according to claim 14, wherein a variable resistance material of the variable resistance element contains chalcogenide.

19. The nonvolatile memory device according to claim 18, wherein the chalcogenide is germanium antimony tellurium (GeSbTe) alloy.

20. The nonvolatile memory device according to claim 14, wherein the memory cell includes a current limiter which has a function of limiting a current flowing through the variable resistor element.

21. The nonvolatile memory device according to claim 20, wherein the current limiter is a diode.

22. The nonvolatile memory device according to claim 21, wherein the diode is a PN junction diode or a schottky barrier diode.

23. The nonvolatile memory device according to claim 20, wherein the current limiter is a varistor.

24. The nonvolatile memory device according to claim 23, wherein a material of the varistor contains zinc oxide (ZnO) or strontium titanate ($SrTiO_3$) as a main component.

25. The nonvolatile memory device according to claim 1, wherein a material for the thermal diffusion barrier is chosen such that at a prescribed thickness,
the thermal diffusion barrier is sufficient to prevent heat from a selected memory cell undergoing programming and/or resetting to diffuse to an adjacent unselected memory cell such that the unselected memory cell substantially remains at 300K temperature, and
an electrical resistance of the thermal diffusion barrier is less than or substantially equal to one percent of an electrical resistance of the variable resistor element at low resistance mode.

26. The nonvolatile memory device according to claim 1, wherein no memory cell is provided with a cell select transistor.

27. The nonvolatile memory device according to claim 1, wherein the thermal diffusion barrier is formed of manganese or bismuth.

28. The nonvolatile memory device according to claim 14, wherein a material for the thermal diffusion barrier is chosen such that at a prescribed thickness,
the thermal diffusion barrier is sufficient to prevent heat from a selected memory cell undergoing programming and/or resetting to diffuse to an adjacent unselected memory cell such that the unselected memory cell substantially remains at 300K temperature, and
an electrical resistance of the thermal diffusion barrier is less than or substantially equal to one percent of an electrical resistance of the variable resistor element at low resistance mode.

29. The nonvolatile memory device according to claim 14, wherein no memory cell is provided with a cell select transistor.

30. The nonvolatile memory device according to claim 14, wherein the thermal diffusion barrier is formed of manganese or bismuth.

* * * * *